United States Patent [19]

Kobayashi et al.

[11] Patent Number: 5,013,526

[45] Date of Patent: May 7, 1991

[54] SUPERCONDUCTING ALLOYS COMPRISING TUNGSTEN, MOLYBDENUM, SILICON AND OXYGEN

[75] Inventors: Nobuyoshi Kobayashi, Kawagoe; Masayuki Suzuki; Seiichi Kondo, both of Kokubunji; Makoto Matsui, Kunitachi; Kiichiro Mukai, Hachioji, all of Japan

[73] Assignee: Hitachi, Ltd., Tokyo, Japan

[21] Appl. No.: 438,596

[22] Filed: Nov. 17, 1989

[30] Foreign Application Priority Data

Nov. 24, 1988 [JP] Japan .................. 63-294532

[51] Int. Cl.$^5$ .............. H01L 39/22; H01L 27/12; B32B 9/06

[52] U.S. Cl. .................. 420/430; 204/192.24; 357/4; 420/429; 420/431; 420/901; 427/62; 428/620; 428/660

[58] Field of Search .................. 428/620, 660; 420/429-431, 43 L, 901; 204/192.24; 427/62; 437/192, 200; 357/4, 5

[56] References Cited

U.S. PATENT DOCUMENTS

| | | | |
|---|---|---|---|
| 4,005,990 | 2/1977 | Newkirk et al. | 427/62 |
| 4,319,256 | 3/1982 | Tarutani et al. | 357/5 |
| 4,398,341 | 8/1983 | Geipel, Jr. et al. | 437/192 |
| 4,608,296 | 8/1986 | Keem et al. | 357/4 |
| 4,640,004 | 2/1987 | Thomas et al. | 437/192 |
| 4,851,295 | 7/1989 | Brors et al. | 437/200 |
| 4,884,111 | 11/1989 | Nishino et al. | 357/4 |
| 4,888,629 | 12/1989 | Harada et al. | 357/4 |
| 4,892,843 | 1/1990 | Schmitz et al. | 437/200 |

OTHER PUBLICATIONS

B. W. Roberts, Jour. Phys. & Chem. Ref. Data, vol. 5 (1976), pp. 581-821, Enclosed p. 720.
Drake et al., IBM-TDB, vol. 21 (4), 1978 p. 1698.
Kubo, Jour. Appl. Phys. 63 (1988), 2033.
Nakajima et al., Jap. Jour. Appl. Phys. 26 (1987) Suppl. 26-3, p. 1440.
Flukiger et al., Solid St. Comm. 14 (1974), 443.

*Primary Examiner*—Upendra Roy
*Attorney, Agent, or Firm*—Kenyon & Kenyon

[57] ABSTRACT

A superconducting material made of tungsten or molybdenum containing a specified amount of silicon, a wiring made of this superconducting material, and a semiconductor device using this wiring.

The above-mentioned superconducting material undegoes no damage even in the steps of heat treatments effected after the formation of a wiring therefrom by virtue of its high melting point, and can be very easily patterned by reactive ion etching using $SF_6$ as an etching gas, which has heretofore been generally employed. These features, in which conventional superconducting materials are lacking, allow the superconducting material of the present invention to exhibit excellent properties particularly when used in the wirings of a semiconductor device.

12 Claims, 1 Drawing Sheet

SUPERCONDUCTING ALLOYS COMPRISING TUNGSTEN, MOLYBDENUM, SILICON AND OXYGEN

BACKGROUND OF THE INVENTION

The present invention relates to a superconducting material and more specifically to a superconducting material suited particularly to the electrodes, wirings, etc. of semiconductor devices and the like.

Conventional metallic materials exhibiting superconductivity above the liquid helium temperature (4.2° K.) include metals such as niobium and lead, and alloys such as Nb$_3$Sn. Where the electrodes and wirings of a semiconductor device are to be formed from such superconducting materials, it is customary to use niobium, lead or the like capable of being rather easily formed into thin film through electron beam deposition, sputtering or the like process.

Although niobium, lead and the like can be easily formed into thin films, the low melting points thereof present various problems including failure in a high level of heat treatment that is carried out after film formation in the step of producing a semiconductor device; a difficulty in fine patterning through dry etching; and a liability of the characteristics of a thin superconducting film formed therefrom to change in heat cycles between room temperature and a low temperature.

Niobium and lead as the conventional superconducting materials are notably different in characteristics from polysilicon, aluminum, tungsten, etc. used as the materials in customary processes for producing a semiconductor device. This presents a difficulty in producing therefrom a semiconductor device having fine and stable superconducting wirings.

Electrodes and wirings having such an extremely high conductivity as to ward off increase in electric resistance even if they have a decreased cross-sectional area have recently been in strong demand in step with a remarkable progress of miniaturization and an increase in the operation speed of semiconductor devices.

However, the formation of the electrodes and wirings of semiconductor devices from superconducting materials having the highest conductivity has involved the many problems mentioned above and, hence, has encountered a difficulty in materialization thereof.

SUMMARY OF THE INVENTION

The present invention provides a superconducting material which can solve the above-mentioned problems of the prior art and is highly adapted to customary processes for producing a semiconductor device, and which exhibits superconductivity above the liquid helium temperature (4.2° K.).

The present invention also provides an electrode and wiring made of a superconducting material suited to a semiconductor device having a high density of integration.

The present invention further provides a semiconductor device having electrodes and wirings made of a superconducting material which has a high density of integration and a capability of high speed operation.

In accordance with the present invention, a material containing silicon and comprising tungsten or molybdenum as the main component is used as a superconducting material in order to provide the above-described characteristics.

Tungsten and molybdenum are not only low in electric resistance (10 $\mu\Omega$.cm in the case of a thin film) and high in melting point (3,300° C.) but also capable of being easily fine-patterned through dry etching using a gas containing SF$_6$ or Cl$_2$. In view of this, they are widely used as barrier metals in the electrodes, wirings and contact portions of semiconductor devices, and can be expected to be usable in many other applications.

However, the superconducting transition temperatures, Tc, of tungsten and molybdenum themselves are quite low and it is, for example, 0.012° K. in the case of tungsten. It has been discovered that the incorporation of silicon to tungsten or molybdenum is very effective in providing a Tc of above 4.2° K. (the liquid helium temperature), for example, 4.5° K.

In addition, it has been discovered that the excellent properties inherent in tungsten and molybdenum as the materials of electrodes and wirings of semiconductor devices do not largely change even when 2 to 40 atomic % of silicon is incorporated in tungsten or molybdenum. Furthermore, a thin film thereof containing silicon can be easily formed through either customary sputtering or low-pressure chemical vapor deposition (CVD) using tungsten hexafluoride (WF$_6$) or molybdenum hexafluoride (MoF$_6$).

DETAILED DESCRIPTION

Tungsten films containing silicon were grown on respective single crystal silicon substrates at a substrate temperature of 236° C. or 354° C. by the low pressure CVD method using WF$_6$ and SiH$_4$ as source gases. In addition to WF$_6$ and SiH$_4$, argon was used as the carrier gas. The total pressure was 0.65 Torr in all runs. The resulting films containing impurities were examined by Auger electron spectroscopy (AES) to calculate the amounts of the impurities based on the sensitivity correction coefficient. Table 1 shows the conditions of formation, thicknesses, resistivities at room temperature of the respective tungsten films, the amounts of silicon contained in the respective films, and the amounts of oxygen and fluorine contained as the impurities in the respective films. The electric resistances of the tungsten films were measured using respective samples prepared by a procedure of patterning a tungsten film formed on a single crystal silicon substrate into the form of a four-terminal element using the customary photolithographic technique. The patterning of the tungsten film was effected by removing the unnecessary portions thereof through well-known reactive ion etching using SF$_6$. These samples were cooled to the liquid helium temperature (4.2° K.), and the electric resistances of the samples were measured by the well-known four-terminal method. Samples which showed an electric resistance reading of zero within the range of measurement error were assumed to be superconducting materials. Table 1 lists samples which exhibited a residual electric resistance like those of common metals and samples which exhibited superconductivity. As will be apparent from this Table, the samples having a silicon content of 2.0 to 40 atomic % had super conductivity, while no superconductivity was observed in the samples having a silicon content falling outside the above-mentioned range. The resistivities at room temperature of tungsten films which exhibited superconductivity were about 100 to 200 μΩ.cm, which were about 20 times as high as the resistivity values of corresponding bulk materials but sufficiently low as the resistivities of materials for electrodes and wirings. In addition, these films are so easily patterned by dry etching that they are suitable as the materials of fine electrode and wirings of semiconductor devices. All these samples showed a Tc of 4.4 to 4.7 K when examined by raising the temperature thereof from 4.2 K.

It is also recognized that tungsten films containing certain amount of silicon could be formed by CVD method using $WF_6$ where $Si_2H_6$, $SiH_2Cl_2$ and other silicon-containing reaction gases were used instead of $SiH_4$.

in an amount comparable to that of oxygen (about 3 atomic %).

Figure 1A:
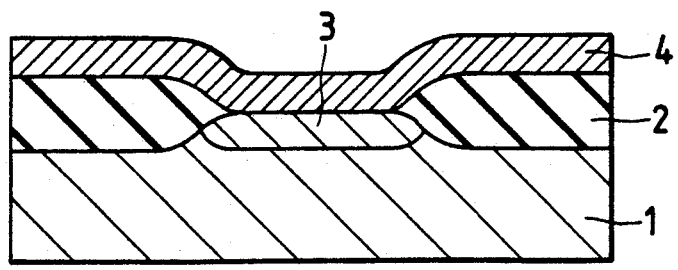
FIGS. 1a to 1c are process diagrams illustrative of a process for producing the semiconductor device as one embodiment of the present invention.
Figure 1B:
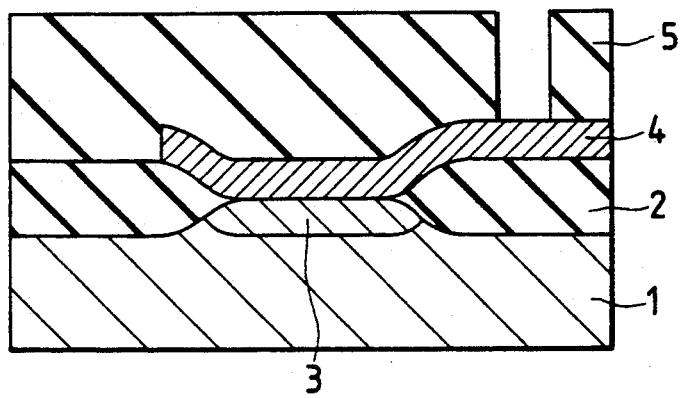
Figure 1C:
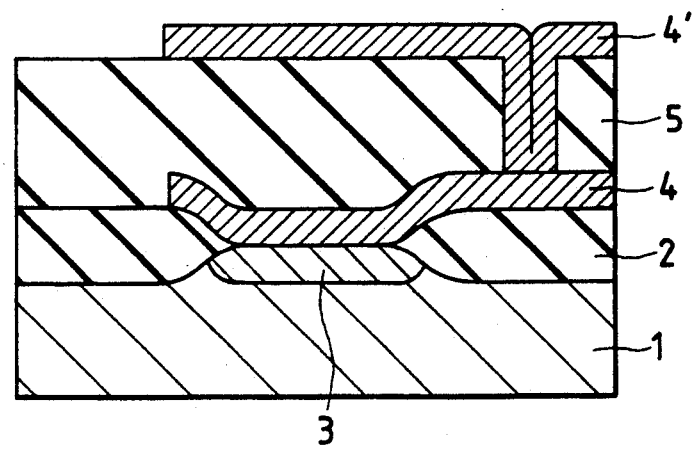

Next, a description will be made of another embodiment according to the present invention while referring to FIGS. 1a to 1c. This embodiment is concerned with a case where tungsten films containing silicon were used as the electrodes and wirings of a silicon semiconductor device. As shown in FIG. 1a, a field oxide film 2 was first formed on a p-type silicon (100) substrate 1 (2–5Ω.cm) by a method as employed in a customary process for producing a semiconductor device, followed by ion implantation of arsenic ions. Thereafter, the resulting structure was heated at 900° C. for 20 minutes to form an n+-type doped region 3. Subsequently, a tungsten film 4 containing 5.2 atomic % of silicon and having a thickness of 300 nm was formed by the low-pressure CVD method using $WF_6$ and $SiH_4$ as

TABLE 1

| wafer No. | Deposition conditions | | | | | | Film characteristics | | Composition | | | Resistivity (4.2K) μΩ·cm |
|---|---|---|---|---|---|---|---|---|---|---|---|---|
| | $WF_6$ sccm | $SiH_4$ sccm | $N_2 + Ar$ sccm | total pressure torr | temp. °C. | time min | film thickness mm | resistivity (room temp.) μΩcm | Si % | O % | F % | |
| 1 | | 30 | 1190 | | | 12 | 500 | 149 | 1.5 | 1.0 | 0.30 | 130.2 |
| 2 | | 40 | 1180 | | | 12 | 700 | 60.2 | 1.5 | 1.1 | 0.37 | 55.3 |
| 3 | | 60 | 1160 | | | 9 | 667 | 64.7 | 1.6 | 0.86 | 0.36 | 60.0 |
| 4 | | 80 | 1140 | | 236 | | 567 | 106 | 2.0 | 0.90 | 0.31 | superconductivity (~0) |
| 5 | | 120 | 1100 | | | | 733 | 217 | 3.5 | 1.0 | 0.38 | superconductivity (~0) |
| 6 | | 160 | 1060 | | | 6 | 933 | 214 | 16.1 | 1.0 | 0.27 | superconductivity (~0) |
| 7 | | 240 | 980 | | | | 433 | 163 | 40.0 | 1.0 | 0.28 | superconductivity (~0) |
| 8 | 80 | 30 | 1190 | 0.65 | | 12 | 500 | 10.0 | 0.20 | 1.1 | 0.31 | 6.0 |
| 9 | | 40 | 1180 | | | 12 | 767 | 13.8 | 0.27 | 1.0 | 0.32 | 7.2 |
| 10 | | 60 | 1160 | | | 9 | 733 | 16.1 | 0.29 | 1.1 | 0.23 | 8.3 |
| 11 | | 80 | 1140 | | 354 | | 600 | 16.8 | 0.40 | 1.0 | 0.33 | 10.2 |
| 12 | | 120 | 1100 | | | | 1167 | 365 | 4.0 | 2.8 | 0.27 | superconductivity (~0) |
| 13 | | 160 | 1060 | | | 6 | 933 | 205 | 13.6 | 0.88 | 0.29 | superconductivity (~0) |
| 14 | | 240 | 980 | | | | 800 | 257 | 43.1 | 0.64 | 0.27 | 250.1 |

While the thin tungsten films containing silicon were formed by the low-pressure CVD method using $WF_6$ and $SiH_4$ as the reactive gases in this embodiment, investigations were also made of a case of forming a film by sputtering. Simultaneous sputtering of a silicon substrate with tungsten and silicon was effected by colliding $Ar^+$ ions simultaneously against a tungsten target and a silicon target while keeping a silicon substrate at room temperature to form a tungsten film containing 5.0 atomic % of silicon on the above-mentioned substrate. The electric resistance at 4.2° K. of the tungsten film was measured to find out whether it exhibited superconductivity. It was recognized from that examination that such a film did exhibit superconductivity. Furthermore, it was determined that a tungsten target containing silicon opposed to two different targets, could be used to form such a thin superconducting film by sputtering. Thus, it was confirmed that a superconducting film can be obtained through film formation according to sputtering, in addition to the CVD process.

It was also confirmed that impurities, such as oxygen (O) and fluorine (F), contained in tungsten had no grave influences on the Tc and the like of a superconducting film as can be seen in Table 1 which shows no such influences, for example, even when the oxygen (O) content was in the range of 0.86 to 2.8 atomic %. It was further confirmed that tungsten can be used as the material for superconducting electrodes and wirings even when it contains at least one element out of the group of transition metals such as titanium, ruthenium and rhenium and other elements such as carbon and germanium the source gases. The unnecessary portions of the film 4 were removed by well-known photo-lithography to be patterned into an electrode and wiring. Either where the adhesion of the film 4 to the field oxide film 2 is insufficient, or where a barrier metal is necessary between the film 4 and the n+-type doped region 3, a barrier metal film such as a TiN film or a TiW film may be preliminarily formed below the tungsten film 4 by sputtering deposition, CVD, or the like. Thereafter, as shown in FIG. 1b, a phosphosilicate glass (PSG) film 5 having a thickness of 900 nm was formed by the low pressure CVD method, heated at 700° C. for 30 minutes, and then subjected to customary photo-lithography to form a through hole of 0.5 μm in diameter on the tungsten film wiring 4.

Thereafter, a tungsten film 4' containing 5.2 atomic % of silicon was further formed by the low-pressure CVD method using $WF_6$ and $SiH_4$, and patterned into a wiring according to customary photoetching. The conditions of the formation of this film 4' were the same as those of the formation of the first tungsten film 4. The patterning of the film 4' was effected by reactive ion etching using $SF_6$, which is a method most generally employed in patterning of tungsten and molybdenum films. It was confirmed that the above-mentioned method can be employed to pattern tungsten or molybdenum films containing 0.2 to 40 atomic % of silicon without any trouble at all to form electrodes and wirings of semiconductor devices. As demonstrated in this embodiment, customary processes for producing a silicon semiconductor device can be employed to form not only monolayer electrodes and wirings but also multilayer electrodes and wirings made of tungsten containing silicon. It was confirmed that the electrode and wirings 4 and 4' made of tungsten containing silicon could be used as superconducting electrodes and wirings when the semiconductor device was cooled to 4.2 K.

While only the tungsten film electrode and wirings have been demonstrated in the foregoing embodiments, at least one kind of film selected from among a group including an aluminum film, silicide films respectively derived from aluminum, tungsten, molybdenum and titanium, a polysilicon film, and a TiN film, which are used in common semiconductor devices, can be combined with a tungsten film as mentioned above to form a laminated film, which is then formed into electrodes and wirings.

It was recognized that molybdenum containing an equivalent amount of silicon can be used instead of the aforementioned tungsten containing silicon to secure the same level of superconductivity, so that it can be used to form superconducting electrodes and wirings for a semiconductor device.

The electrode and wiring of the present invention must be cooled to a given low temperature in order to be used in a superconducting stage. Thus, a semiconductor device provided with electrodes and wirings according to the present invention is cooled by cooling means using liquid helium. Various means, including contact of liquid helium with a cooling fin provided on the rear side of a semiconductor device, can be employed as the cooling means using liquid helium. For example, provision of cooling means as employed in cooling a Josephson device gave good results.

As has been described in detail hereabove, in accordance with the present invention, fine electrodes and wirings capable of exhibiting superconductivity above, 4.2° K. can be formed using tungsten or molybdenum having an excellent adaptability to processes for producing a semiconductor device. According to the present invention, customary low-pressure CVD and sputtering, which have heretofore been employed, can be employed to facilitate thin film formation and patterning capable of withstanding heat treatments at high temperatures in succeeding steps. Thus, the present invention is superior from the viewpoints of economy and efficiency.

What is claimed is:

1. A superconducting material comprising tungsten, 2 to 40 atomic % of silicon, and 0.88 to 2.8 atomic % of oxygen.

2. A superconducting material as claimed in claim 1, which contains at least one element selected from among titanium, ruthenium, rhenium, carbon and germanium.

3. A superconducting material as claimed in claim 1 which contains 0.27 to 0.38 atomic % of fluorine.

4. A superconducting wiring comprising a predetermined form of a tungsten containing 2.0 to 40 atomic % of silicon.

5. A superconducting wiring as claimed in claim 4, which is formed on a semiconductor substrate provided with means for cooling the same to a temperature at which said wiring exhibits superconductivity and 0.88 to 2.8 atomic % of oxygen.

6. A superconducting wiring as claimed in claim 4, wherein said wiring contains 0.88 to 2.8 atomic % of oxygen.

7. A superconducting wiring as claimed in claim 4, wherein said wiring contains at least one element selected from among titanium, ruthenium, rhenium, carbon and germainum.

8. A superconducting wiring as claimed in claim 4, wherein said wiring contains 0.27 to 0.38 atomic % of fluorine.

9. A superconducting wiring as claimed in claim 4, wherein said tungsten film is combined with at least one kind of film selected from among an aluminum film, silicide films, a polycrystalline silicon film a titanium-tungsten film and a titanium nitride film to provide a laminated structure.

10. A superconducting material comprising tungsten or molybdenum and 2.0 to 40 atomic % of silicon and 0.88 to 2.8 atomic % of oxygen.

11. A superconducting material comprising tungsten or molybdenum and 2.0 to 40 atomic % of silicon and fluorine.

12. A superconducting material comprising tungsten or molybdenum and 2.0 to 40 atomic % of silicon and 0.27 to 0.38 atomic % of fluorine.

* * * * *

UNITED STATES PATENT AND TRADEMARK OFFICE
CERTIFICATE OF CORRECTION

PATENT NO. : 5,013,526
DATED : May 7, 1991
INVENTOR(S) : Nobuyoshi KOBAYASHI et al.

It is certified that error appears in the above-identified patent and that said Letters Patent is hereby corrected as shown below:

On the title page,

| | Line | |
|---|---|---|
| ABSTRACT | 6 | Change "degoes" to --dergoes--. |

| Column | Line | |
|---|---|---|
| 1 | 39 | After "off" insert --an--. |
| 3 | 14 | Before "certain" insert --a--; before "CVD" insert --the--. |
| 5 | 5 | Change "4.2" to --4.2°--. |
| 5 | 38 | After "above" delete ",". |
| 6 | 14 | After "tungsten" insert --film--. |
| 6 | 15 | After "silicon" insert --and 0.88 to 2.8 atomic % of oxygen--. |
| 6 | 19-20 | After "superconductivity" delete "and 0.88 to 2.8 atomic % of oxygen". |
| 6 | 34 | After "film" insert --,--. |

Signed and Sealed this

Second Day of February, 1993

*Attest:*

STEPHEN G. KUNIN

*Attesting Officer*    Acting Commissioner of Patents and Trademarks